(12) United States Patent
Lim

(10) Patent No.: US 7,898,300 B2
(45) Date of Patent: Mar. 1, 2011

(54) PEAK DETECTOR

(75) Inventor: Kyoo Hyun Lim, Gyeonggi-do (KR)

(73) Assignee: FCI Inc., Seongnam-Si (KR)

( * ) Notice: Subject to any disclaimer, the term of this patent is extended or adjusted under 35 U.S.C. 154(b) by 117 days.

(21) Appl. No.: 12/440,822

(22) PCT Filed: Aug. 24, 2007

(86) PCT No.: PCT/KR2007/004061

§ 371 (c)(1),
(2), (4) Date: Mar. 11, 2009

(87) PCT Pub. No.: WO2008/032940

PCT Pub. Date: Mar. 20, 2008

(65) Prior Publication Data

US 2010/0073033 A1 Mar. 25, 2010

(30) Foreign Application Priority Data

Sep. 11, 2006 (KR) .................. 10-2006-0087141

(51) Int. Cl.
*H03K 5/153* (2006.01)
(52) U.S. Cl. .............................. 327/58; 327/59; 327/60
(58) Field of Classification Search .................. 327/58, 327/59, 60
See application file for complete search history.

(56) References Cited

U.S. PATENT DOCUMENTS 4,160,175 A * 7/1979 Trout ........................... 327/72
5,025,176 A   6/1991 Takeno
2005/0285633 A1 12/2005 Nakamura

FOREIGN PATENT DOCUMENTS

| JP | 57-22568 A | 2/1982 |
|---|---|---|
| JP | 2-201271 A | 8/1990 |
| JP | 5-346440 A | 12/1993 |
| JP | 6-82493 A | 3/1994 |

* cited by examiner

*Primary Examiner*—Lincoln Donovan
*Assistant Examiner*—John W Poos
(74) *Attorney, Agent, or Firm*—Drinker Biddle & Reath LLP

(57) ABSTRACT

A peak detector capable of rapidly detecting a peak value of a signal is provided. The peak detector includes first and second operational amplifiers and an auxiliary current source to detect two rail to rail signals. The first operational amplifier outputs a detection signal by buffering a first rail to rail input signal. The second operational amplifier outputs a control signal in response to a second rail to rail input signal and the detection signal. The auxiliary current source includes a terminal connected to an output terminal of the first operational amplifier and the other terminal connected to the first or second source voltage. The auxiliary current source operates in response to the control signal. The auxiliary current source supplies a current from the first source voltage to the output terminal in response to the control signal or supplies a path for discharging a current from the output terminal to the second source voltage.

11 Claims, 2 Drawing Sheets

[Fig. 1]
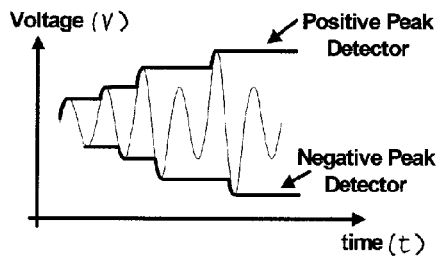
[Fig. 2]
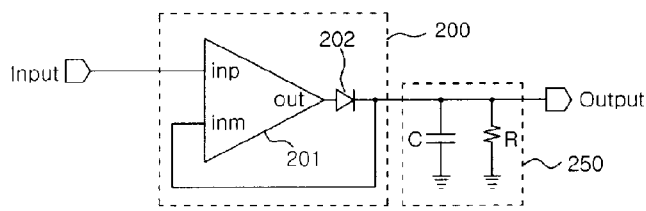
[Fig. 3]
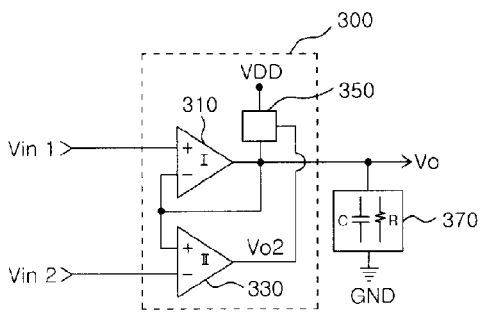
[Fig. 4]
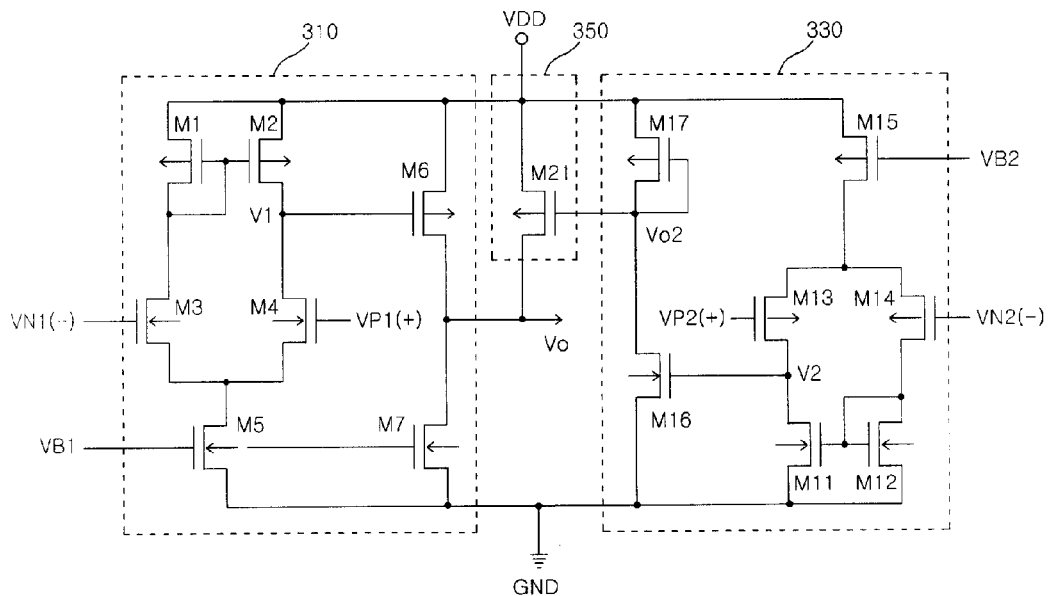

[Fig. 5]
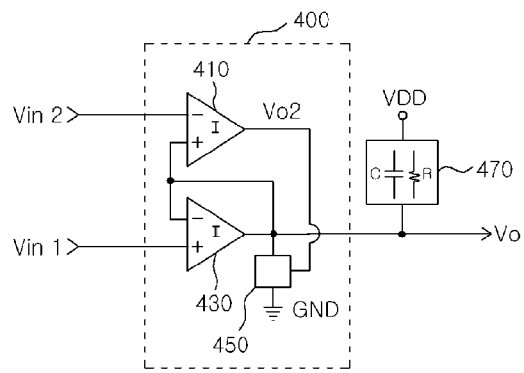
[Fig. 6]
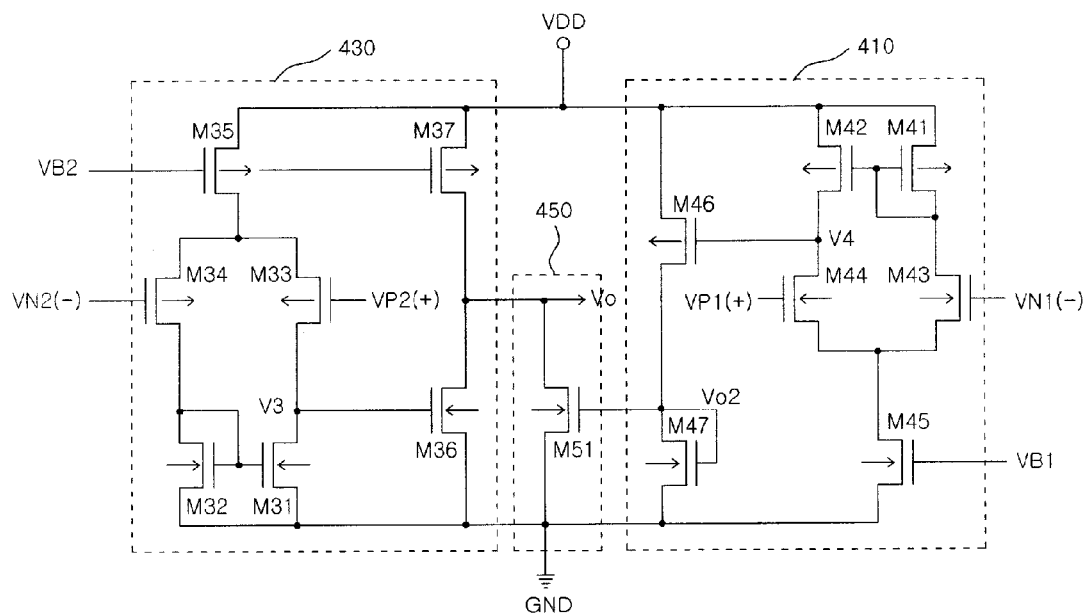

PEAK DETECTOR

TECHNICAL FIELD

Field of the Invention

The present invention relates to a peak detector, and more particularly, to a peak detector with a high response speed.

BACKGROUND ART

Description of the Related Art

A peak detector serves to detect a highest or lowest voltage of a signal.

FIG. 1 illustrates a waveform for explaining a concept of a peak detector.

Referring to FIG. 1, when a frequency and an amplitude of an analogue signal (a thin solid line) changes with time, a positive peak detector continuously detects only the maximum amplitude of the signal (an upper thick solid line), and a negative peak detector continuously detects only the minimum amplitude of the signal (a lower thick solid line).

A positive peak detector detects the maximum amplitude of the analogue signal. When detecting a peak voltage of which voltage level is higher than that of a maintained previous detection voltage while continuously watching the signal by maintaining a detection voltage corresponding to a detected voltage, a voltage value corresponding to a newly detected maximum voltage value is output, and the aforementioned job is continuously performed as long as the signal is input.

The negative peak detector detects the minimum amplitude value from the analogue signal. When detecting a peak voltage of which voltage level is lower than that of a maintained previous detection voltage while continuously watching the signal by maintaining a detection voltage corresponding to a detected voltage, a voltage value corresponding to a newly detected minimum voltage value is output, and the aforementioned job is continuously performed as long as the signal is input.

Although it is shown in FIG. 1 that a single peak detector detects positive and negative peaks of the analogue signal, two detection signals are combined into one drawing for convenience of description. In practice, the two peaks are detected by using two peak detectors.

FIG. 2 is a conventional peak detector circuit.

Referring to FIG. 2, a conventional peak detector 200 includes an operational amplifier 201 and a diode 202. The peak detector 200 transmits a peak value of a signal obtained by buffering an input signal applied to a positive input terminal inp to a load 250. For this, the peak detector 200 outputs an output of the operational amplifier 201 to a negative input terminal inm of the operational amplifier 201 via the diode 202 in a feedback manner. The positive and negative peak detectors are distinguished from each other based on a direction in which the diode is connected.

DISCLOSURE OF INVENTION

Technical Problem

As shown in FIG. 2, since the conventional peak detector 200 is a serial combination of the operational amplifier 201 and the diode 202, a response speed may be reduced, or peaks may be inaccurately detected depending on a frequency and amplitude of the input signal.

Technical Solution

The present invention provides a peak detector capable of rapidly detecting a peak value of an input signal.

According to an aspect of the present invention, there is provided a peak detector including first and second operational amplifiers and an auxiliary current source, which detects a peak of two rail to rail input signals. The first operational amplifier outputs a detection signal by buffering a first rail to rail input signal. The second operational amplifier outputs a control signal in response to the second rail to rail input signal and the detection signal. The auxiliary current source, which includes a terminal connected to an output terminal of the first operational amplifier and the other terminal connected to a first or second source voltage, operates in response to the control signal. The auxiliary current source supplies a current from the first source voltage to the output terminal in response to the control signal or supplies a path for discharging a current from the output terminal to the second source voltage.

ADVANTAGEOUS EFFECTS

The peak detector according to an embodiment of the present invention is capable of rapidly detecting a peak of a signal by adding a path through which a current is supplied from a voltage source with a high voltage level when the peak detector is used as a positive detector and by adding a path through which a current is discharged from a voltage source with a low voltage level when the peak detector is used as a negative peak detector. In addition, a voltage range of an input signal is wide, since an input of the peak detector operates as a rail to rail signal.

BRIEF DESCRIPTION OF THE DRAWINGS

The above and other features and advantages of the present invention will become more apparent by describing in detail exemplary embodiments thereof with reference to the attached drawings in which:

FIG. 1 illustrates a waveform for explaining a concept of a peak detector;

FIG. 2 is a conventional peak detector circuit;

FIG. 3 is a circuit diagram illustrating a peak detector according to an embodiment of the present invention, when the peak detector is used as a positive peak detector;

FIG. 4 is a detailed circuit diagram illustrating a positive peak detector shown in FIG. 3;

FIG. 5 is a circuit diagram illustrating a peak detector according to an embodiment of the present invention, when the peak detector is used as a negative peak detector; and FIG. 6 is a detailed circuit diagram of the negative peak detector shown in FIG. 5 according to an embodiment of the present invention.

MODE FOR THE INVENTION

Hereinafter, exemplary embodiments of the present invention will be described in detail with reference to the attached drawings.

FIG. 3 is a circuit diagram illustrating a peak detector according to an embodiment of the present invention, when the peak detector is used as a positive peak detector.

Referring to FIG. 3, a positive peak detector 300 includes a first operational amplifier 310, a second operational amplifier 330, and an auxiliary current source 350. A load 370 is used to maintain a detected voltage value as a peripheral circuit of the positive peak detector 300. In general, the load 370 includes a capacitor C and a resistor R.

The first operational amplifier 310 includes a positive input terminal (+) applied with a first rail to rail input signal Vin1 and a negative input terminal (−) connected to an output terminal Vo. The second operational amplifier 330 includes a negative input terminal (−) applied with a second rail to rail input signal Vin2 and a positive input terminal (+) applied with a detection signal Vo of the output terminal of the first operational amplifier 310. The auxiliary current source 350 includes a terminal connected to a first source voltage VDD and the other terminal connected the output terminal Vo of the first operational amplifier 310. An operation of the auxiliary current source 350 is controlled by a control signal Vo2 of the output terminal of the second operational amplifier 330. Here, a reference numeral Vo is commonly allocated to an output terminal and a detection signal at the output terminal.

When detecting a positive peak of a rail to rail voltage signal by using the positive peak detector 300, two rail to rail input signals Vin1 and Vin2 becomes an input signal of the positive peak detector 300. Amplitude and phase of the two rail to rail input signals Vin1 and Vin2 are same.

Since a negative input terminal (−) is connected to an output terminal Vo, the first operational amplifier 310 operates as a buffer with respect to an first input signal Vin1. Accordingly, the first input signal Vin1 applied to the positive input terminal of the first operational amplifier 310 becomes a voltage at the output terminal Vo as it is. A response speed of a case where a change in the first input signal Vin1 appears at the output terminal Vo as it is depends on an output driving capability of the first operational amplifier 310. The voltage at the output terminal Vo having the same voltage level as the first input signal Vin1 is applied to the positive input terminal (+) of the second operational amplifier 330. A voltage value at the output terminal Vo2 of the second operational amplifier 330 is changed depending on a difference between voltage value of the output terminal Vo applied to the positive input terminal of the second operational amplifier 330 and voltage value of the second input signal Vin2 applied to the negative input terminal. The auxiliary current source 350 supplies a constant amount of current from the first source voltage VDD to the output terminal of the first operational amplifier 310 in response to the voltage at the output terminal Vo2 of the second operational amplifier 330.

When a voltage level of the first input signal Vin1 increases, the voltage at the output terminal Vo of the first operational amplifier 310 increases so as to have same amplitude as the increasing voltage level of the first input signal. A response delay time of the first operational amplifier 310 on the first input signal Vin1 depends on an output driving capability of the first operational amplifier 310. During the response delay time, the voltage of the output terminal Vo is lower than the voltage of the first input signal Vin1. Because the positive input terminal (+) is connected to the output terminal Vo, and the negative input terminal (−) is applied with the second input signal Vin2, a voltage at the output terminal Vo2 of the second operational amplifier 330 decreases during the response delay time. When a current supplied from the auxiliary current source 350 increases proportional to a decrease in the voltage at the output terminal Vo2 of the second operational amplifier 330, the voltage of the output terminal Vo of the first operational amplifier 310 is quickly settled to same voltage of the first input signal Vin1.

When the voltage levels of the first input signal Vin1 and the second input signal Vin2 are commonly decreased or maintained as the current state, the voltage at the output terminal Vo of the first operational amplifier 310 is decreased or maintained as the current voltage value. Especially, when the voltage levels of the first input signal Vin1 and the second input signal Vin2 are commonly decreased, the voltage at the output terminal Vo2 of the second operational amplifier 330 is increased, thereby closing a current path through which a current is supplied from the auxiliary current source 350.

When the voltage level of the first input signal Vin1 is decreased, in order to reduce the voltage at the output terminal Vo of the first operational amplifier 310, charges accumulated in the capacitor C which constitutes the load 370 have to be discharged through the output terminal of the first operational amplifier 310. At this time, the discharging speed depends on the voltage difference between the voltage level of the first input signal Vin1 and the voltage level of the output terminal Vo. In order to stabilize the voltage at the output terminal Vo of the first operational amplifier 310 even when the voltage level of the first input signal Vin1 is decreased, an output end of the first operational amplifier needs to be suitably designed. In order to stabilize the voltage at the output terminal Vo in the simplest manner, an amount of the current that flows from the output end to the outside or from the outside to the output end has to be sufficiently increased.

FIG. 4 is a detailed circuit diagram illustrating a positive peak detector shown in FIG. 3.

Referring to FIG. 4, the first operational amplifier 310 includes seven MOS transistors M1 to M7. The second operational amplifier 330 also includes seven MOS transistors M11 to M17. The auxiliary current source 350 includes a single MOS transistor M21.

The first operational amplifier 310 is a general two-stage operational amplifier constructed with an input stage M1 to M5 and an output stage M6 and M7.

The input stage is constructed with five MOS transistors M1 to M5.

A first MOS transistor M1 includes a terminal connected to a first source voltage VDD, a gate terminal, and the other terminal connected to the gate terminal. A second MOS transistor M2 includes a terminal connected to the first source voltage VDD, the other terminal connected to a first node voltage V1, and a gate terminal connected to the gate terminal of the first MOS transistor M1. A third MOS transistor M3 includes a terminal connected to the other terminal of the first MOS transistor M1 and a gate terminal VN1(−) applied with the detection signal Vo (refer to FIG. 3). A fourth MOS transistor M4 includes a terminal connected to the first node voltage V1 and a gate terminal VP1(+) applied with the first input signal Vin1 (refer to FIG. 3). A fifth MOS transistor M5 includes a terminal commonly connected to the other terminal of the third MOS transistor M3 and the other terminal of the fourth MOS transistor M4, the other terminal connected to a second source voltage GND, and a gate terminal applied with a first bias voltage VB1.

The output stage is constructed with two MOS transistors M6 and M7.

A sixth MOS transistor M6 includes a terminal connected to the first source voltage VDD, a gate terminal applied with the first node voltage V1, and the other terminal, which outputs the detection signal Vo in response to the first node voltage V1. A seventh MOS transistor M7 includes a terminal connected to the second source voltage GND, a gate terminal applied with the first bias voltage VB1, and the other terminal which outputs the detection signal Vo together with the other terminal of the sixth MOS transistor M6.

The auxiliary current source 350 includes a 21-th MOS transistor M21 including a terminal connected to the first source voltage VDD, the other terminal connected to the terminal which outputs the detection signal Vo, and a gate terminal applied with a control signal Vo2 that is output from the second operational amplifier 330.

Hereinafter, the operation of the first operational amplifier will be described.

The input stage outputs a first node voltage V1 in response to signals Vin1 and Vo respectively applied to two input terminals VN1 and VP1. The output stage outputs the detection signal Vo in response to the first node voltage V1. It is assumed that a voltage applied to a negative input terminal VN1 is fixed and that a signal applied to a positive input terminal VP1 is increased. When the signal applied to the positive input terminal VP1 is increased, a voltage level of the first node voltage V1 is decreased. A voltage level of the detection signal Vo is increased by the sixth MOS transistor M6 which operates in response to the first node voltage V1.

In the sixth MOS transistor M6 which constitute the output stage of the first operational amplifier 310, a ratio W/L of width W to length L of the gate is determined so that a capability for supplying a current to the terminal which outputs the detection signal Vo is maximized. In the seventh MOS transistor M7, a ratio of width to length of the gate is determined so that a discharging speed of charges accumulated in the terminal Vo which outputs the detection signal Vo is minimized. Accordingly, a positive voltage of an input signal is rapidly detected and output. On the contrary, when the input signal is equal to or lower than the current detection voltage, a speed of reducing the voltage level of the current detection signal due to the discharge is suppressed as much as possible.

The second operational amplifier 330 is a general two-stage operational amplifier constructed with an input stage M11 to M15 and an output stage M16 and M17.

The input stage includes five MOS transistors M11 to M15.

A first MOS transistor M11 includes a terminal connected to the second source voltage GND and the other terminal connected to a terminal which outputs a second node voltage V2. A second MOS transistor M12 includes a terminal connected to the second source voltage GND, a gate terminal, and the other terminal commonly connected to the gate terminal and the gate terminal of the first MOS transistor M11. A third MOS transistor M13 includes a terminal connected to a terminal which outputs the second node voltage V2 and a gate terminal VP2(+) applied with the detection signal Vo (refer to FIG. 3). A fourth MOS transistor M14 includes a terminal connected to the other terminal of the second MOS transistor M12 and a gate terminal VN2(−) applied with the second input signal Vin2 (refer to FIG. 3). A fifth MOS transistor M15 includes a terminal commonly connected to the other terminal of the third MOS transistor M13 and the other terminal of the fourth MOS transistor M14, the other terminal connected to the first source voltage VDD, and a gate terminal applied with a second bias voltage VB2.

The output stage includes two MOS transistors M16 and M17.

A sixth MOS transistor M16 includes a terminal connected to the second source voltage GND, a gate terminal applied with the second node voltage V2, and the other terminal which outputs the control signal Vo2 in response to the second node voltage V2. A seventh MOS transistor M17 includes a terminal connected to the first source voltage VDD, a gate terminal, and the other terminal connected to the gate terminal to output the control signal Vo2 together with the other terminal of the sixth MOS transistor M16.

Hereinafter, the operation of the second operational amplifier 330 will be described.

The input stage outputs the second node voltage V2 in response to the signals Vin2 and Vo respectively applied to the two input terminals VN2(−) and VP2(+). The output stage generates the control signal Vo2 in response to the second node voltage V2. It is assumed that a signal applied to the positive input terminal VP2 is fixed and that a signal applied to the negative input terminal VN2 is increased. When the signal applied to the negative input terminal VN2 is increased, a voltage level of the second node voltage V2 is increased, and a voltage level of the terminal which outputs the control signal Vo2 is decreased by the sixth MOS transistor M16 that operates in response to the second node voltage V2.

A current supplied to a node which outputs the detection signal Vo from the first source voltage VDD via a 21-th MOS transistor M21 is increased proportional to a decrease in the voltage level of the control signal Vo2 applied to the gate. Since the increased current is used to charge a capacitor C included in the load 370, a response time for which a change in a voltage applied to the positive input terminal VP1 appears as the change in the voltage level of the detection signal Vo is reduced.

The first and second operational amplifiers 310 and 330 are general two-stage operational amplifiers. While the first operational amplifier 310 uses two N-type MOS transistors M3 and M4 as input terminals, the second operational amplifier 330 uses two P-type MOS transistors M13 and M14 as input terminals. The first operational amplifier 310 may have the same structure as the second operational amplifier 330. However, transmission features of the N-type and P-type MOS transistors may be mutually compensated for each other by applying the detection signal Vo of the output terminal Vo of the first operational amplifier 310 to a gate of the N-type MOS transistor M3 which constitutes the first operational amplifier 310 and a gate of the P-type MOS transistor M14 which constitutes the second operational amplifier 330, at the same time.

Structures of the MOS transistors used for the auxiliary current source 350 are changed depending on structures of the MOS transistors which constitute the first and second operational amplifiers 310 and 330. In the embodiment, the P-type MOS transistor M21 is used.

The two bias voltages VB1 and VB2 may be generated by a bias circuit (not shown) independently from each other. Alternatively, one bias voltage of the two bias voltages VB1 and VB2 may be generated by using the other bias voltage.

FIG. 5 is a circuit diagram illustrating a peak detector according to an embodiment of the present invention, when the peak detector is used as a negative peak detector.

Referring to FIG. 5, a negative peak detector 400 includes first and second operational amplifiers 410 and 430 and an auxiliary current source 450. A load 470 is used to maintain a detected voltage value, as a peripheral circuit of the positive peak detector 400. In general, the load 470 includes a capacitor C and a resistor R.

The first operational amplifier 410 includes a negative input terminal applied with a second input signal Vin2 and a positive input terminal applied with a detection signal Vo. The second operational amplifier 430 includes a positive input terminal applied with a first input signal Vin1 and a negative input terminal connected to an output terminal to output the detection signal Vo. The auxiliary current source 450 includes a terminal connected to an output terminal Vo of the second operational amplifier 430 and the other terminal connected to a ground voltage GND. The operation of the auxiliary current source 450 is controlled by a voltage value of the output terminal Vo2 of the first operational amplifier 410.

Since the negative input terminal is connected to the output terminal, the second operational amplifier 430 operates as a buffer with respect to an input signal. Accordingly, the first input signal Vin1 applied to the positive input terminal of the second operational amplifier 430 becomes the detection signal of the output terminal Vo as it is. A response speed of a case where a change in the first input signal Vin1 appears as a voltage level of the detection signal Vo of the output terminal Vo depends on an output driving capability of the second operational amplifier 430. The detection signal Vo having the same voltage level as a value of the first input signal Vin1 is applied to the positive input terminal of the first operational amplifier 410. Since the amplitude and phase of the second input signal Vin2 is equal to the first input signal Vin1, a voltage level of a control signal Vo2 that output from the first operational amplifier 410 is changed depending on a voltage difference of the detection signal Vo and the second input signal Vin2. During the response delay time of the second amplitude 430, the voltage level for the detection signal Vo is higher than the second input signal Vin2, the voltage level of the control signal Vo2 output from the first amplifier 410 is increased. The auxiliary current source 450 supplies a discharging path through which a constant amount current is discharged from the output terminal of the second operational amplifier 430 to the ground voltage GND in response to the control signal Vo2 that is output from the first operational amplifier 410.

A current that is discharged from a terminal represented by the detection signal Vo to the ground voltage GND via the auxiliary current source 450 is increased proportional to an increase in the voltage level of the control signal Vo2 that is output from the first operational amplifier 410. That is, a negative voltage is rapidly detected with respect to an input signal by rapidly discharging charges accumulated in the capacitor C which constitutes the load 470.

When the voltage level of the first input signal Vin1 is increased or maintained as the current state, the voltage level of the detection signal Vo that is output from the second operational amplifier 430 is increased or maintained as the current voltage value. Especially when the voltage level of the first input signal Vin1 is increased, the voltage level of the control signal Vo2 is decreased, thereby closing the discharge path passing through the auxiliary current source 450.

FIG. 6 is a detailed circuit diagram of the negative peak detector shown in FIG. 5 according to an embodiment of the present invention.

Referring to FIG. 6, a first amplifier 410 includes seven MOS transistors M41 to M47. A second amplifier 430 includes seven MOS transistors M31 to M37. An auxiliary current source 450 includes a single MOS transistor M51.

Since the first amplifier 410, the second amplifier 430, and the auxiliary current source 450 are similar to those shown in FIG. 4, differences there between will be described.

While the gate of the seventh MOS transistor M7 which constitutes the output stage of the first operational amplifier 310 shown in FIG. 4 is applied with the first bias voltage VB1, a gate of a seventh MOS transistor M47 which constitutes an output stage of the first amplifier 410 shown in FIG. 6 is connected to a terminal of the seventh MOS transistor M47.

While the gate of the seventh MOS transistor M17 which constitute an output stage of the second operational amplifier 330 shown in FIG. 4 is connected to the terminal of the seventh MOS transistor M17, a gate of a seventh MOS transistor M37 which constitutes an output stage of the second amplifier 430 is applied with a second bias voltage VB2.

While the auxiliary current source 350 shown in FIG. 4 generates a current path from the first source voltage VDD to the output terminal Vo by using the P-type MOS transistor M21, the auxiliary current source 450 shown in FIG. 6 generates a path through which charges are discharged from the output terminal Vo to the second source voltage GND by using the N-type MOS transistor M51.

The rest parts shown in FIG. 6 are the same as those shown in FIG. 4.

Like in FIG. 4, two bias voltages VB1 and VB2 shown in FIG. 6 may be generated by a bias circuit (not shown) independently from each other. Alternatively, one bias voltage of the two bias voltages VB1 and VB2 may be generated by using the other bias voltage.

In a sixth MOS transistor M36 of the second amplifier 430, a ratio W/L of width W to length L of the gate is determined so that charges are discharged from the output terminal Vo as fast as possible. In a seventh MOS transistor M37, a ratio W/L of width W to length L of the gate is determined so that a current supplied from the first source voltage VDD to the output terminal Vo is suppressed as much as possible. Accordingly, a negative voltage of an input signal is speedily detected and output. On the contrary, when an input signal is equal to or higher than the current detection voltage, it is possible to maintain the voltage level of the current detection signal Vo as long as possible.

While the present invention has been particularly shown and described with reference to exemplary embodiments thereof, it will be understood by those skilled in the art that various changes in form and details may be made therein without departing from the spirit and scope of the present invention as defined by the appended claims.

The invention claimed is:

1. A peak detector for detecting a peak of two rail to rail input signals, the peak detector comprising:
 a first operational amplifier outputting a detection signal Vo by buffering a first rail to rail input signal, the first operational amplifier including a terminal that receives the first rail to rail input signal and the other terminal that is connected to the output terminal wherein structures of input transistors which constitute an input stage of the first operational amplifier are opposite to those of input transistors which constitute an input stage of the second operational amplifier;
 a second operational amplifier outputting a control signal in response to a second rail to rail input signal and the detection signal; and
 an auxiliary current source including a terminal connected to an output terminal of the first operational amplifier and the other terminal connected to a first source voltage or second source voltage, which operates in response to the control signal,
 wherein the auxiliary current source supplies a current from the first source voltage to the output terminal in response to the control signal or discharges a current from the output terminal to the second source voltage.

2. The peak detector according to claim 1,
 wherein when the input transistors which constitute the input stage of the first operational amplifier are N-type MOS transistors, the input transistors which constitute the input stage of the second operational amplifier are P-type MOS transistors.

3. The peak detector according to claim 1,
 wherein the auxiliary current source is a MOS transistor including a terminal connected to the output terminal of the first operational amplifier, the other terminal connected to the first source voltage or the second source voltage, a gate terminal applied with the control voltage, and
 a base terminal applied with the control voltage.

4. The peak detector according to claim 3, wherein the first source voltage is relatively higher than the second source voltage.

5. The peak detector according to claim 4, wherein the first source voltage is the highest source voltage among source voltages used by the peak detector, and wherein the second source voltage is the lowest source voltage among source voltages used by the peak detector.

6. A positive peak detector for detecting a positive peak of two rail to rail signals, the positive peak detector comprising:
a first operational amplifier including a positive input terminal applied with a first rail to rail input signal, a negative input terminal, and an output terminal connected to the negative input terminal, the first operational amplifier including input and output stages, wherein the input stage comprises:
a first MOS transistor including a terminal connected to the first source voltage, a gate terminal, and the other terminal connected to the gate terminal;
a second MOS transistor including a terminal connected to the first source voltage and a gate terminal connected to the gate terminal of the first MOS transistor;
a third MOS transistor including a terminal connected to the other terminal of the first MOS transistor and a gate terminal applied with the detection signal;
a fourth MOS transistor including a terminal connected to the other terminal of the second MOS transistor and a gate terminal applied with the first rail to rail input signal; and
a fifth MOS transistor including a terminal commonly connected to the other terminal of the third MOS transistor and the other terminal of the fourth MOS transistor, the other terminal connected to the second source voltage, and a gate terminal applied with a first bias voltage, and wherein the output stage comprises:
a sixth MOS transistor including a terminal connected to the first source voltage and a gate terminal connected to a common terminal of the second and fourth MOS transistors; and
a seventh MOS transistor including a gate terminal applied with the first bias voltage, a terminal connected to the other terminal of the sixth MOS transistor to output the detection signal, and the other terminal connected to the second source voltage;
a second operational amplifier including a negative input terminal applied with a second rail to rail input signal and a positive input terminal connected to an output terminal of the first operational amplifier; and
an auxiliary current source including a terminal connected to the first source voltage and the other terminal connected to the output terminal of the first operational amplifier, which is controlled by a voltage value of an output terminal of the second operational amplifier.

7. The positive peak detector according to claim 6, wherein the second operational amplifier includes input and output stages, wherein the input stage comprises:
a first MOS transistor including a terminal connected to the second source voltage;
a second MOS transistor including a terminal connected to the second source voltage, a gate terminal, and the other terminal commonly connected to the gate terminal and the gate terminal of the first MOS transistor;
a third MOS transistor including a terminal connected to the other terminal of the first MOS transistor and a gate terminal applied with the detection signal;
a fourth MOS transistor including a terminal connected to the other terminal of the second MOS transistor and a gate terminal applied with the second rail to rail input signal; and
a fifth MOS transistor including a terminal commonly connected to the other terminal of the third MOS transistor and the other terminal of the fourth MOS transistor, the other terminal connected to the first source voltage, and a gate terminal applied with a second bias voltage, and wherein the output stage comprises:
a sixth MOS transistor including a terminal connected to the second source voltage and a gate terminal connected to a common terminal of the first and third MOS transistors; and
a seventh MOS transistor including a gate terminal, a terminal commonly connected to the gate terminal and the other terminal of the sixth MOS transistor to output the control signal, and the other terminal connected to the first source voltage.

8. The positive peak detector according to claim 6, wherein the auxiliary current source is a MOS transistor including a terminal connected to the output terminal of the first operational amplifier, the other terminal connected to the first source voltage, and a gate terminal applied with the control voltage.

9. A negative peak detector for detecting a negative peak of two rail to rail signals, the negative peak detector comprising:
a first operational amplifier including a negative input terminal applied with a second rail to rail input signal, which outputs a control signal, the first operational amplifier including input and output stages, wherein the input stage comprises:
a first MOS transistor including a terminal connected to the first source voltage, a gate terminal, and the other terminal connected to the gate terminal;
a second MOS transistor including a terminal connected to the first source voltage and a gate terminal connected to the gate terminal of the first MOS transistor;
a third MOS transistor including a terminal connected to the other terminal of the first MOS transistor and a gate terminal applied with the second rail to rail input signal;
a fourth MOS transistor including a terminal connected to the other terminal of the second MOS transistor and a gate terminal applied with the detection signal; and
a fifth MOS transistor including a terminal commonly connected to the other terminal of the third MOS transistor and the other terminal of the fourth MOS transistor, the other terminal connected to the second source voltage, and a gate applied with a first bias voltage, and wherein the output stage comprises:
a sixth MOS transistor including a terminal connected to the first source voltage and a gate terminal connected to a common terminal of the second and fourth MOS transistors; and
a seventh MOS transistor including a gate terminal, a terminal connected to the gate terminal and the other terminal of the sixth MOS transistor to output the control signal, and the other terminal connected to the second source voltage;
a second operational amplifier including a positive input terminal applied with a first rail to rail input signal, an output terminal, and a negative input terminal commonly connected to the output terminal and a positive input terminal of the first operational amplifier to output a detection signal; and
an auxiliary current source including a terminal connected to the output terminal of the second operational amplifier and the other terminal connected to a second source voltage, which is controlled by the control signal.

10. The negative peak detector according to claim 9, wherein the second operational amplifier includes input and output stages, wherein the input stage comprises:
a first MOS transistor including a terminal connected to the second source voltage;
a second MOS transistor including a terminal connected to the second source voltage and a gate terminal connected to the other terminal and a gate terminal of the first MOS transistor;
a third MOS transistor including a terminal connected to the other terminal of the first MOS transistor and a gate terminal applied with the first rail to rail input signal;
a fourth MOS transistor including a terminal connected to the other terminal of the second MOS transistor and a gate terminal applied with the detection signal; and
a fifth MOS transistor including a terminal commonly connected to the other terminal of the third MOS transistor and the other terminal of the fourth MOS transistor, the other terminal connected to the second source voltage, and a gate applied with a second bias voltage, and wherein the output stage comprises:
a sixth MOS transistor including a terminal connected to the second source voltage and a gate terminal connected to a common terminal of the first and the third MOS transistors; and
a seventh MOS transistor including a terminal connected to the first source voltage, a gate terminal applied with the second bias voltage, and the other terminal connected to the other terminal of the sixth MOS transistor to output the detection signal.

11. The negative peak detector according to claim 9, wherein the auxiliary current source is a MOS transistor including a terminal connected to the output terminal of the second operational amplifier, the other terminal connected to the second source voltage, and a gate terminal applied with the second control voltage.

* * * * *